United States Patent
Nguyen

(10) Patent No.: US 7,443,716 B2
(45) Date of Patent: Oct. 28, 2008

(54) SPATIAL LIGHT MODULATOR WITH FOUR TRANSISTOR ELECTRODE DRIVER

(75) Inventor: Thu Nguyen, Palo Alto, CA (US)

(73) Assignee: Miradia Inc., Sunnyvale, CA (US)

( * ) Notice: Subject to any disclaimer, the term of this patent is extended or adjusted under 35 U.S.C. 154(b) by 386 days.

(21) Appl. No.: 11/282,056

(22) Filed: Nov. 16, 2005

(65) Prior Publication Data
US 2007/0109021 A1    May 17, 2007

(51) Int. Cl.
*G11C 11/00*    (2006.01)
(52) U.S. Cl. ...................................... 365/154
(58) Field of Classification Search ............ 345/84, 345/85, 87, 90, 92, 98; 365/154, 185.07; 359/291, 290, 295, 223, 224, 248, 245; 342/21, 342/27; 324/765, 763
See application file for complete search history.

(56) References Cited

U.S. PATENT DOCUMENTS

| | | | |
|---|---|---|---|
| 5,548,301 | A | 8/1996 | Kornher et al. |
| 6,191,883 | B1 * | 2/2001 | Huffman et al. ............ 359/291 |
| 6,731,533 | B2 | 5/2004 | Deng et al. |
| 2006/0198181 | A1 * | 9/2006 | Luk et al. .................... 365/154 |

OTHER PUBLICATIONS

Urano, M. Ishii, H. Tanabe, Y. Shimamura, T. Sakata, T. Kamei, T. Kudou, K. Yano, M. Machida, K., "Novel fabrication process and structure of a low-voltage-operation micromirror array for optical MEMS switches", Electron Devices Meeting, 2003. IEDM '03 Technical Digest. IEEE International, Dec. 8-10, 2003, pp. 39.5.1-39.5.4.*

* cited by examiner

*Primary Examiner*—Richard Elms
*Assistant Examiner*—Harry W Byrne
(74) *Attorney, Agent, or Firm*—Townsend and Townsend and Crew LLP

(57) ABSTRACT

A memory cell for driving a complementary pair of electrodes associated with a micro-mirror of a spatial light modulator. The memory cell includes a first PMOS transistor, wherein a source of the first PMOS transistor is coupled to a first supply voltage. The memory cell also includes a first NMOS transistor, wherein a drain of the first NMOS transistor is coupled to a drain of the first PMOS transistor, a source of the first NMOS transistor is coupled to a second supply voltage, and a gate of the first NMOS transistor is coupled to a gate of the first PMOS transistor. The memory cell further includes a second transistor adapted to establish a conduction path between the gate of the first NMOS transistor and at least one of the first supply voltage or the second supply voltage. Moreover, the memory includes a select transistor, wherein a drain of the select transistor is coupled to the gate of the first NMOS transistor and wherein the memory cell is free from a connection to a fifth transistor.

30 Claims, 8 Drawing Sheets

SPATIAL LIGHT MODULATOR WITH FOUR TRANSISTOR ELECTRODE DRIVER

BACKGROUND OF THE INVENTION

This present invention relates generally to spatial light modulators. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

Spatial light modulators (SLMs) have numerous applications in the areas of optical information processing, projection displays, video and graphics monitors, televisions, and electrophotographic printing. Reflective SLMs are devices that modulate incident light in a spatial pattern to reflect an image corresponding to an electrical or optical input. The incident light may be modulated in phase, intensity, polarization, or deflection direction. A reflective SLM is typically comprised of an area or two-dimensional array of addressable picture elements (pixels) capable of reflecting incident light.

Some conventional SLMs utilize array designs that include an array of micro-mirrors with a set of electrodes and a memory array positioned underneath each of the micro-mirrors. For display applications, the micro-mirrors are generally fabricated using semiconductor processing techniques to provide devices with dimensions on the order of 15 μm×15 μm. Using such small mirrors enables display applications to use SLMs in applications characterized by increased image resolution for a given display size. Merely by way of example, HDTV systems, with a resolution of 1,080 scan lines×1,920 pixels/line, are currently available to consumers.

In some applications, the memory array associated with an electrode is fabricated using DRAM memory cells. DRAM cells provide benefits in some SLM applications including device sizes appropriate to the micro-mirror pixel size discussed above. However, DRAM cells leak charge during operation, resulting in the need to recharge the DRAM cells to the appropriate electrode voltage on a periodic basis. Other applications utilize SRAM memory cells as electrode drivers, such as a six transistor SRAM memory element.

FIG. 7 is a simplified schematic illustration of a conventional six transistor SRAM memory element. As illustrated in FIG. 7, the gates of PMOS transistor 714 and NMOS transistor 716 are coupled and are connected to node 720. The gates of PMOS transistor 710 and NMOS transistor 712 are coupled and are connected to node 722. In general, node 720 is connected to a first terminal and node 720 is connected to a second terminal and the voltages are the two terminals are complementary. Node 720 is connected to an electrode E in FIG. 7 and node 722 is connected to an electrode with an opposite polarity ($\overline{E}$).

The bit line with signal B is connected to the drain/source of NMOS transistor 732 and the bit-bar line with signal $\overline{B}$ is connected to the drain/source of NMOS transistor 734. The gates of transistors 732 and 734 are connected to the wordline (WL). As will be evident to one of skill in the art, prior to writing operations, the bit line B and the bit-bar $\overline{B}$ lines are precharged high. To write a "1" value to node 720, the bit-bar $\overline{B}$ line is pulled to ground (low). Alternatively, To write a "0" value to node 729, the bit line B is pulled to ground. Thus, writing in the conventional six transistor SRAM illustrated in FIG. 7 is performed by precharging both the bit line and the bit-bar line to high and then pulling a selected line (B or $\overline{B}$) to ground. SRAM cells are not susceptible to the current leakage problems characteristic of DRAM cells, but the number of transistors utilized and the geometry of conventional SRAM cells limit their applicability as the micro-mirror geometries decrease in size.

One option for increasing the number of micro-mirrors in an array is to add additional micro-mirrors to the array. However, additional micro-mirrors of a conventional size increases the silicon real estate used to fabricate the array. Another option is to add additional micro-mirrors while decreasing the size of the individual micro-mirrors, thereby maintaining a generally constant array dimension size. As the size of the micro-mirrors is decreased, the dimensions of the memory cells and electrodes associated with each mirror are generally decreased. In some designs, the minimum design rules related to silicon processing of the SRAM cells limits the ability of a designer to reduce the size of the SRAM cells to support the fabrication of smaller micro-mirrors in high resolution display applications. Thus, there is a need in the art for a spatial light modulator with an improved memory cell architecture.

SUMMARY OF THE INVENTION

According to the present invention, techniques related to spatial light modulators are provided. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

In an embodiment of the present invention, a memory cell for driving a complementary pair of electrodes associated with a micro-mirror of a spatial light modulator is provided. The memory cell includes a first PMOS transistor. The source of the first PMOS transistor is coupled to a first supply voltage. In an embodiment, the first supply voltage is $V_{dd}$. The memory cell also includes a first NMOS transistor. The drain of the first NMOS transistor is coupled to a drain of the first PMOS transistor, the source of the first NMOS transistor is coupled to a second supply voltage, and the gate of the first NMOS transistor is coupled to a gate of the first PMOS transistor. In a specific embodiment, the second supply voltage is ground.

The memory cell further includes a second transistor adapted to establish a conduction path between the gate of the first NMOS transistor and at least one of the first supply voltage or the second supply voltage. In an embodiment, the second transistor is a second PMOS transistor. The source of the second PMOS transistor is coupled to the first supply voltage, the gate of the second PMOS transistor is coupled to the drain of the first PMOS transistor, and the drain of the second PMOS transistor is coupled to the gate of the first PMOS transistor. In another embodiment, the second transistor is a second NMOS transistor. The source of the second NMOS transistor is coupled to the second supply voltage, the gate of the second NMOS transistor is coupled to the gate of the first NMOS transistor, and the drain of the second NMOS transistor is coupled to the drain of the first PMOS transistor.

Moreover, the memory cell includes a select transistor. In an embodiment, the select transistor is a third NMOS transistor. The drain of the select transistor is coupled to the gate of the first NMOS transistor. According to embodiments of the present invention, the memory cell is free from a connection to a fifth transistor, for example, a fourth NMOS transistor. According to other embodiments, the memory cell is free from a connection to a sixth transistor.

In another embodiment of the present invention, a method of operating a memory cell for driving a complementary pair of electrodes comprising a first electrode and a second electrode and associated with a micro-mirror of a spatial light modulator is provided. The method includes applying a first drive voltage to a gate of a select transistor. In embodiments of the present invention, the drain of the select transistor is coupled to a first node. The method also includes applying a second drive voltage to a bias line coupled to the first electrode. The first electrode is coupled to the first node. The method further includes shunting current from the first node to a first supply voltage through a PMOS transistor. In embodiments of the present invention, the drain of the PMOS transistor is coupled to the first node and the source of the PMOS transistor is coupled to the first supply voltage. In some embodiments, the first drive voltage is less than 5 V. In other embodiments, the first drive voltage is less than 1.5 V. Moreover, in an embodiment, the second drive voltage is ground.

In an alternative embodiment of the present invention, a method of operating a memory cell for driving a complementary pair of electrodes comprising a first electrode and a second electrode and associated with a micro-mirror of a spatial light modulator is provided. The method includes applying a first drive voltage to a gate of a select transistor. In embodiments of the present invention, the drain of the select transistor is coupled to a first node. The method also includes grounding a bit line coupled to the source of the select transistor and applying a second drive voltage to a bias line coupled to the first electrode. The first electrode is coupled to the first node. The method further includes shunting current from the first node to ground through the select transistor. In an embodiment, the first drive voltage is less than 5 V. In another embodiment, the first drive voltage is less than 1.5 V. According to some embodiments, the second drive voltage is ground.

Numerous benefits are achieved using the present invention over conventional techniques. For example, an embodiment according to the present invention provides faster write operations than conventional electrode drivers. Moreover, embodiments of the present invention provide reductions in the size of the electrode drivers in comparison to conventional devices. For instance, embodiments of the present invention using four transistors may result in electrode drivers using approximately 33% less real estate than six transistor cells. Additionally, embodiments utilize minimum design rule transistors compared to conventional designs that use transistors with features larger than minimum design rules. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

According to the present invention, techniques related to spatial light modulators are provided. More particularly, the invention relates to a method and apparatus for providing control circuitry for actuation of mirrors in a spatial light modulator. Merely by way of example, the invention has been applied to a design of addressing circuitry suitable for driving electrodes associated with micro-mirrors in a spatial light modulator used in a display application. The method and apparatus can be applied to spatial light modulators as well as other devices, for example, micro-electromechanical sensors, detectors, and displays.

Figure 1:
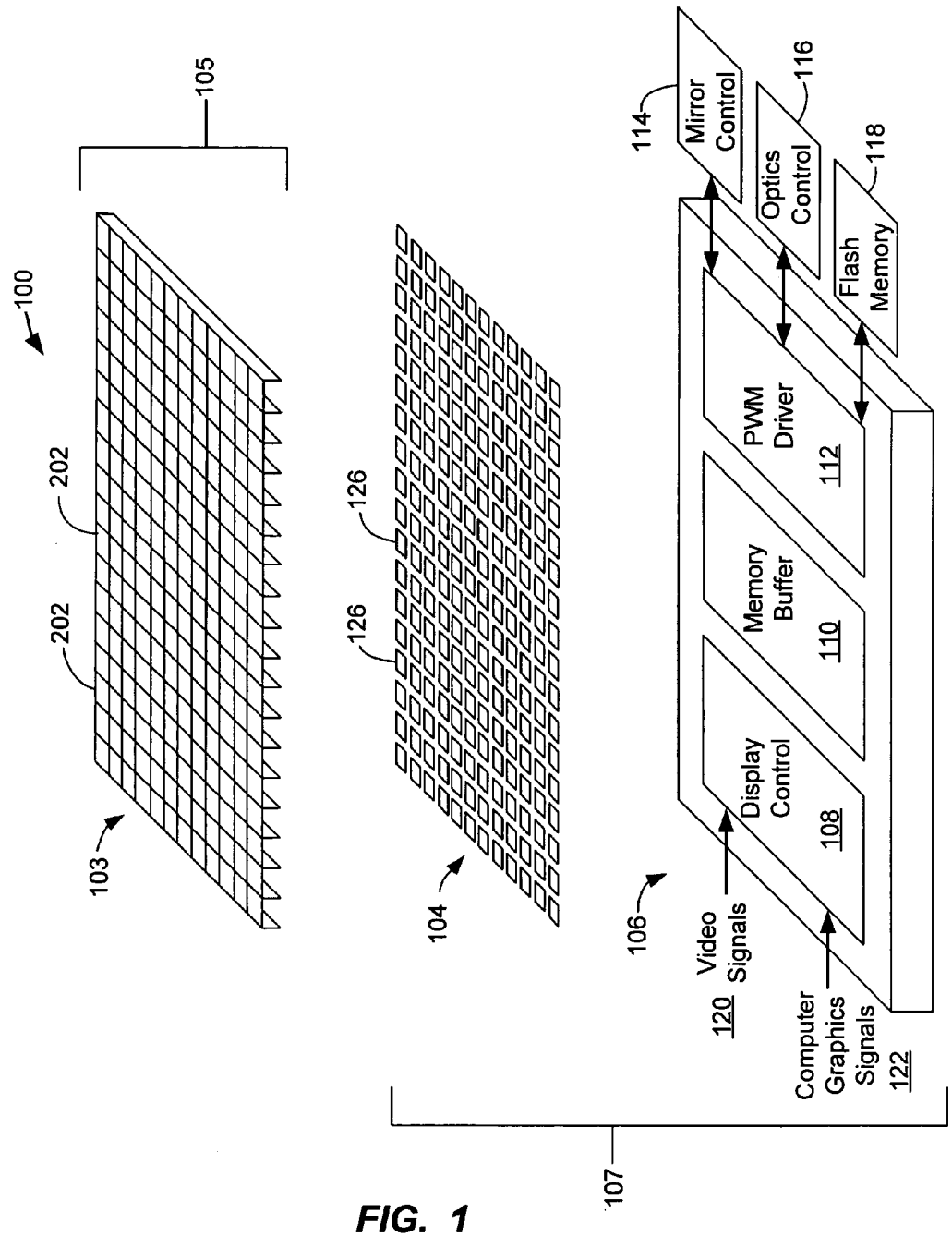
FIG. 1 is a simplified perspective view of an SLM according to an embodiment of the present invention.

FIG. 1 is a diagram that illustrates the general architecture of a spatial light modulator (SLM) 100. The illustrated embodiment has three layers. The first layer is a mirror array 103 that has a plurality of deflectable micro-mirrors 202. In a preferred embodiment, the micro-mirror array 103 is fabricated from a first substrate 105 that is a single material, such as single crystal silicon. Additional details related to SLMs using such an architecture are described in U.S. patent application Ser. No. 10/756,936, filed Jan. 13, 2004, commonly owned, and hereby incorporated by reference for all purposes.

The second layer is an electrode array 104 with a plurality of electrodes 126 for controlling the micro-mirrors 202. Each electrode 126 is associated with a micro-mirror 202 and controls the deflection of that micro-mirror 202. Addressing circuitry allows selection of a single electrode 126 for control of the particular micro-mirror 202 associated with that electrode 126.

The third layer is a layer of control circuitry 106. This control circuitry 106 has addressing circuitry, which allows the control circuitry 106 to control a voltage applied to selected electrodes 126. This allows the control circuitry 106 to control the deflections of the mirrors 202 in the mirror array 103 via the electrodes 126. Typically, the control circuitry 106 also includes a display control 108, line memory buffers 110, a pulse width modulation array 112, and inputs for video signals 120 and graphics signals 122. A microcontroller 114, optics control circuitry 116, and a flash memory 118 may be external components connected to the control circuitry 106, or may be included in the control circuitry 106 in some embodiments. In various embodiments, some of the above listed parts of the control circuitry 106 may be absent, may be on a separate substrate and connected to the control circuitry 106, or other additional components may be present as part of the control circuitry 106 or connected to the control circuitry 106.

In an embodiment according to the present invention, both the second layer 104 and the third layer 106 are fabricated using semiconductor fabrication technology on a single second substrate 107. That is, the second layer 104 is not necessarily separate and above the third layer 106. Rather, the term "layer" is an aid for conceptualizing different parts of the spatial light modulator 100. For example, in one embodiment, both the second layer 104 of electrodes is fabricated on top of the third layer of control circuitry 106, both fabricated on a single second substrate 107. That is, the electrodes 126, as well as the display control 108, line memory buffers 110, and the pulse width modulation array 112 are all fabricated on a single substrate in one embodiment. Integration of several functional components of the control circuitry 106 on the same substrate provides an advantage of improved data transfer rate over conventional spatial light modulators, which have the display control 108, line memory buffers 110, and the pulse width modulation array 112 fabricated on a separate substrate. Further, fabricating the second layer of the electrode array 104 and the third layer of the control circuitry 106 on a single substrate 107 provides the advantage of simple and cheap fabrication, and a compact final product. After the layers 103, 104, and 106 are fabricated, they are bonded together to form the SLM 100. Additional examples of methods for joining the substrates to form a bonded substrate structure are described in U.S. patent application Ser. No. 10/756,923, filed Jan. 13, 2004, commonly owned, and hereby incorporated by reference for all purposes.

As illustrated in FIG. 1, the substrate 105 includes a number of standoff regions extending from a lower portion of the substrate and arranged in an array as a waffle pack grid pattern. The standoff regions are adapted to align with bonding areas located between adjacent electrodes 126. Mirrors 202 are formed in the upper layers of substrate 105 by a release process in later stages of processing. In some designs, the standoff regions provide mechanical support for the mirror structure and are not moveable. Thus, light reflected from the upper surfaces of the standoff structures reduces the contrast of the optical system incorporating the spatial light modulator. In some designs, an absorbent material may be applied to the upper surfaces of the standoff regions to reduce reflections. However, these approaches reduce the fill factor of the array, potentially degrading system performance.

Figure 2:
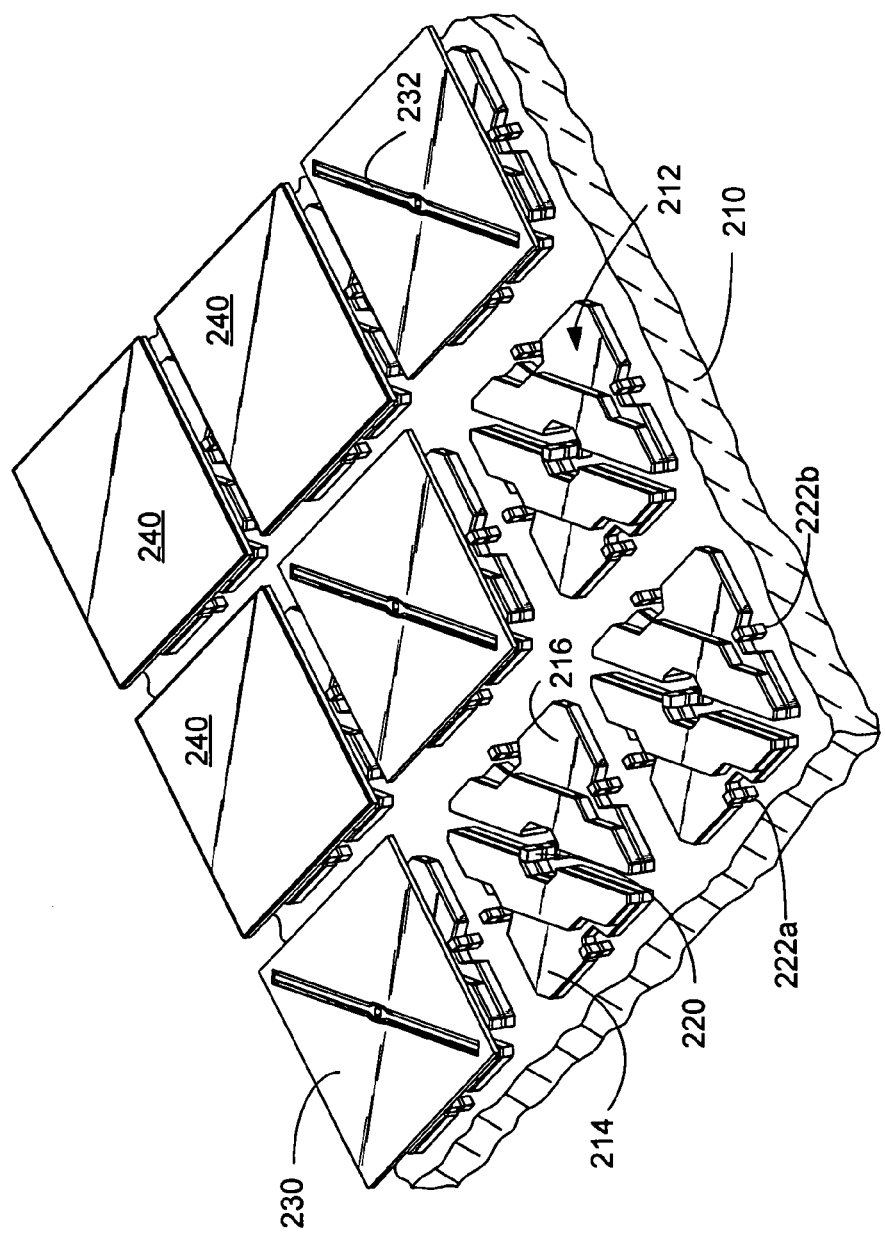
FIG. 2 is a simplified cutaway perspective view of an array of SLMs according to another embodiment of the present invention.

FIG. 2 is a simplified cutaway perspective views of an array of SLMs according to another embodiment of the present invention. As illustrated, this cutaway view is merely representative of the array of SLMs at various stages of processing. As described more fully below, independent control of the SLMs in an array is utilized in embodiments according to the present invention to form images in display applications and other apparatus.

As illustrated in FIG. 2, the array of SLMs is mounted on a support substrate 210. In some embodiments, the support substrate is a silicon substrate with CMOS control circuitry fabricated using semiconductor processing techniques. Multi-level electrodes 212 are coupled to the support substrate 210. As illustrated in FIG. 2, the multi-level electrodes comprise two complementary electrodes 214 (referred to as electrode E) and 216 (referred to as electrode $\bar{E}$) positioned on opposite sides of an integrated standoff structure 220. As described more fully below, drive voltages of opposite polarity are provided to the complementary electrodes, providing both electrostatic attraction and repulsion forces to the micro-mirror plates 230.

FIG. 2 illustrates an embodiment of the present invention in which the complementary electrodes are multi-level electrodes with raised central portions adjacent the center of the micro-mirror plates. Such multi-level electrodes reduce the distance between the top of the electrode surface and the micro-mirror plates, thereby decreasing the magnitude of the addressing voltages used to actuate the micro-mirror plates. However, embodiments of the present invention are not limited to multi-level electrodes. In alternative embodiments, other electrode geometries are utilized. One of ordinary skill in the art would recognize many variations, modifications, and alternatives.

As illustrated in FIG. 2, each micro-mirror plate 230 is coupled to the support substrate 210 by integrated standoff structure 220 and a torsion spring hinge 232. Referring to one of the micro-mirrors 240, upon actuation of the electrodes, the micro-mirror plate rotates in a plane orthogonal to the longitudinal axis of the torsion spring hinge. In some embodiments, the longitudinal axis of the torsion spring hinge is parallel to a diagonal of the micro-mirror plate. The motion of the micro-mirror is arrested by landing structures 222. In order to provide two actuated positions, complementary sets of landing structures 222a and 222b are provided on opposite sides of the integrated standoff structure. Thus, landing structures 222a arrest the motion of the micro-mirrors at a first actuated position and landing structures 222b arrest the motion of the micro-mirrors at a second actuated position. According to embodiments of the present invention, the micro-mirrors are tilted at predetermined angles in the actuated states, providing for controlled reflection of incident radiation.

The support substrate 210, the integrated standoff structures 220, and the micro-mirror plates 230 are joined using a substrate bonding process according to some embodiments of the present invention. In other embodiments, these structures are fabricated using a combination of deposition, patterning, etching, wafer bonding, and other semiconductor processing techniques. As illustrated in FIG. 2, reflective surfaces 240 are formed on the micro-mirror plates, providing an array of SLMs with hidden hinges. For purposes of clarity, the spacing between adjacent micro-mirrors is illustrated in FIG. 2 as a significant fraction of the mirror dimensions. As will be evident to one of skill in the art, reductions in the space between mirrors will result in an increased fill ratio and improved image quality in display applications. The spacing between adjacent micro-mirrors is generally defined using photolithographic processes, providing high fill ratio designs. Additional details related to the fabrication of integrated standoff structures and multi-level electrodes are described in U.S. patent application Ser. No. 11/250,320, filed Oct. 13, 2005, commonly owned, and hereby incorporated by reference for all purposes.

Figure 3A:
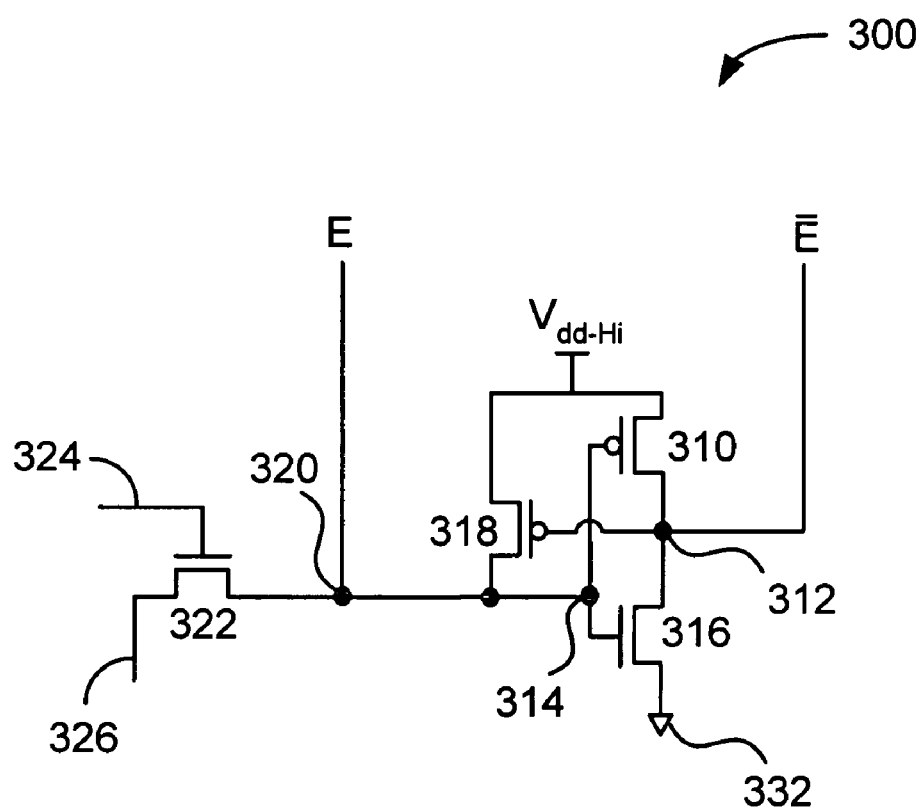
FIG. 3A is a simplified schematic illustration of an electrode driver for an SLM according to an embodiment of the present invention.

FIG. 3A is a simplified schematic illustration of a memory cell for an SLM according to an embodiment of the present invention. As described in more detail throughout the present invention, and more particularly below, memory cells and electrode drivers provided according to embodiments of the present invention are suitable for driving a complementary pair of electrodes associated with a micro-mirror of a spatial light modulator. As illustrated in FIG. 3A, memory cell 300 includes a first PMOS transistor 310. The source of the first PMOS transistor is coupled to a first supply voltage $V_{dd-Hi}$. In embodiments the present invention, the first supply voltage $V_{dd-Hi}$ provides a predetermined voltage to the illustrated circuit. Merely by way of example, in a specific embodiment, the first supply voltage is 12 V. In alternative embodiments, the first supply voltage varies from about 10 V to about 20 V. One of ordinary skill in the art would recognize many variations, modifications, and alternatives.

The memory cell also includes a first NMOS transistor 316. The drain (node 312) of the first NMOS transistor 316 is coupled to the drain of the first PMOS transistor 310. Additionally, the source of the first NMOS transistor 316 is coupled to a second supply voltage 332. As illustrated in FIG. 3A, in a specific embodiment, the second supply voltage 332 is ground. The gate (node 314) of the first NMOS transistor 310 is coupled to the gate of the first PMOS transistor 310.

The memory cells provided according to embodiments of the present invention include a second transistor adapted to establish a conduction path between the gate of the first NMOS transistor and one of the first and second supply voltages. As described more fully below, depending on the embodiment, either a PMOS transistor or an NMOS transistor are utilized as the second transistor. As will be evident to one of skill in the art, the selection of the transistor type will depend on the particular applications.

Referring to FIG. 3A, in an embodiment, the second transistor is a PMOS transistor 318. The source of PMOS transistor 318 is coupled to supply voltage $V_{dd-Hi}$. The gate (node 312) of PMOS transistor 318 is coupled to the drain of the first PMOS transistor 310 and the drain (node 320) of PMOS transistor 318 is coupled to the gate of the first PMOS transistor 310. As described more fully below, PMOS transistor 318 provides a conduction path between the gate of the first NMOS transistor and supply voltage $V_{dd-Hi}$ during writing of a "1" to node 320.

A select transistor 322 is provided as illustrated in FIG. 3A. The drain (node 320) of the select transistor 322 is coupled to the gate of the first NMOS transistor 316. The gate of the select transistor is coupled to control line 324, which is a word line according to some embodiments. Additionally, the source of the select transistor is coupled to additional control line 326, which is a bit line according to some embodiments. Both the word line and the bit line are utilized in embodiments of the present invention as described more fully below. Moreover, complementary electrodes E and $\overline{E}$, coupled to nodes 320 and 312, respectively, are described more fully below.

Figure 3B:
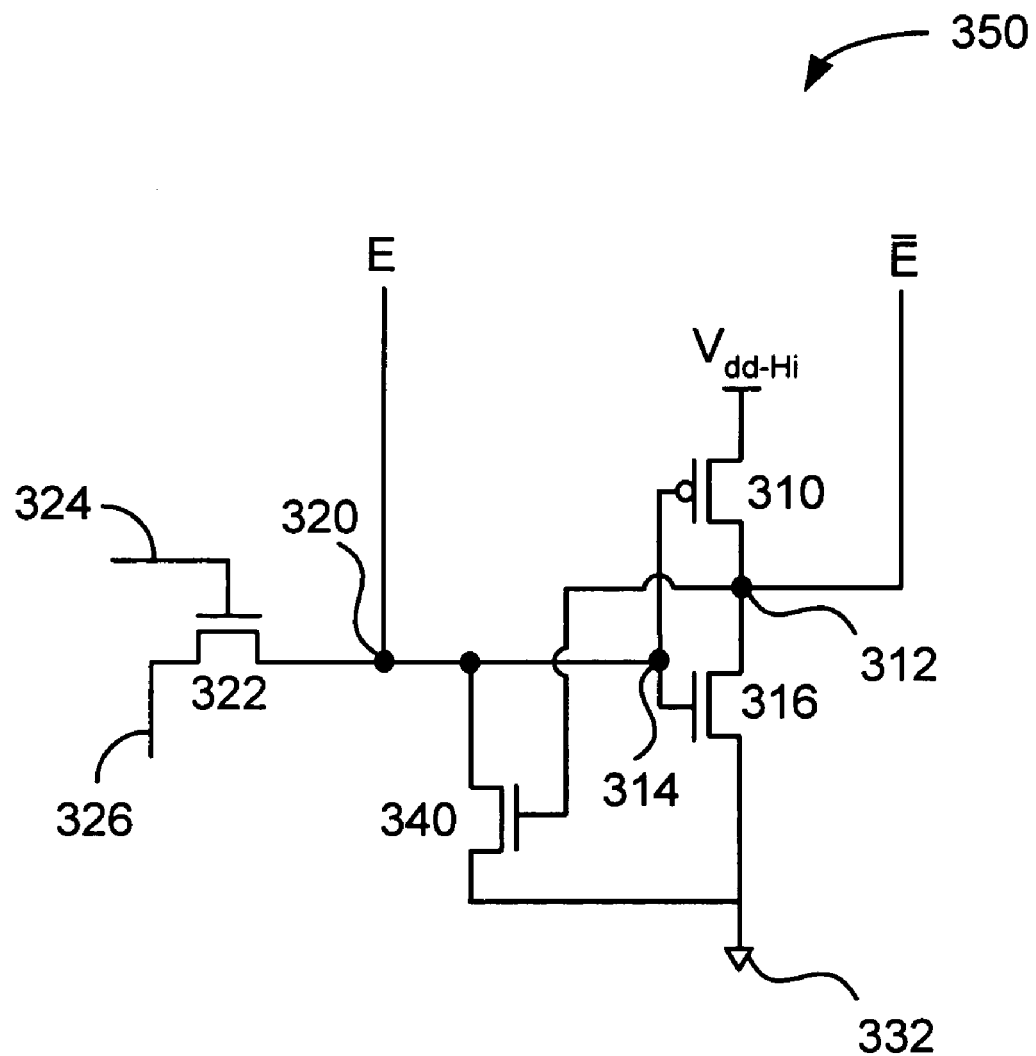
FIG. 3B is a simplified schematic illustration of an electrode driver for an SLM according to another embodiment of the present invention.

FIG. 3B is a simplified schematic illustration of a memory cell 350 for an SLM according to another embodiment of the present invention. As illustrated in FIG. 3B, the second transistor is an NMOS transistor 340. The source of NMOS transistor 340 is coupled to supply voltage 332, the gate of NMOS transistor 340 is coupled to the gate of the first NMOS transistor 316, and the drain of NMOS transistor 340 is coupled to the drain of the first PMOS transistor 310. As described more fully below, NMOS transistor 340 provides a conduction path between the gate of the first NMOS transistor 316 and ground 332 during writing of a "0" to node 320.

In the embodiments illustrated in FIGS. 3A and 3B, all four transistors 310, 316, 318, and 322 or 340 in the memory cells 300 and 350 are minimum design rule transistors. As described in relation to read operations below, embodiments of the present invention are not constrained to rely on device size to prevent flipping of the cell during read operations. Thus, embodiments of the present invention reduce the real estate occupied by the memory cell in comparison with conventional designs by utilizing minimum design rule transistors.

Figure 4:
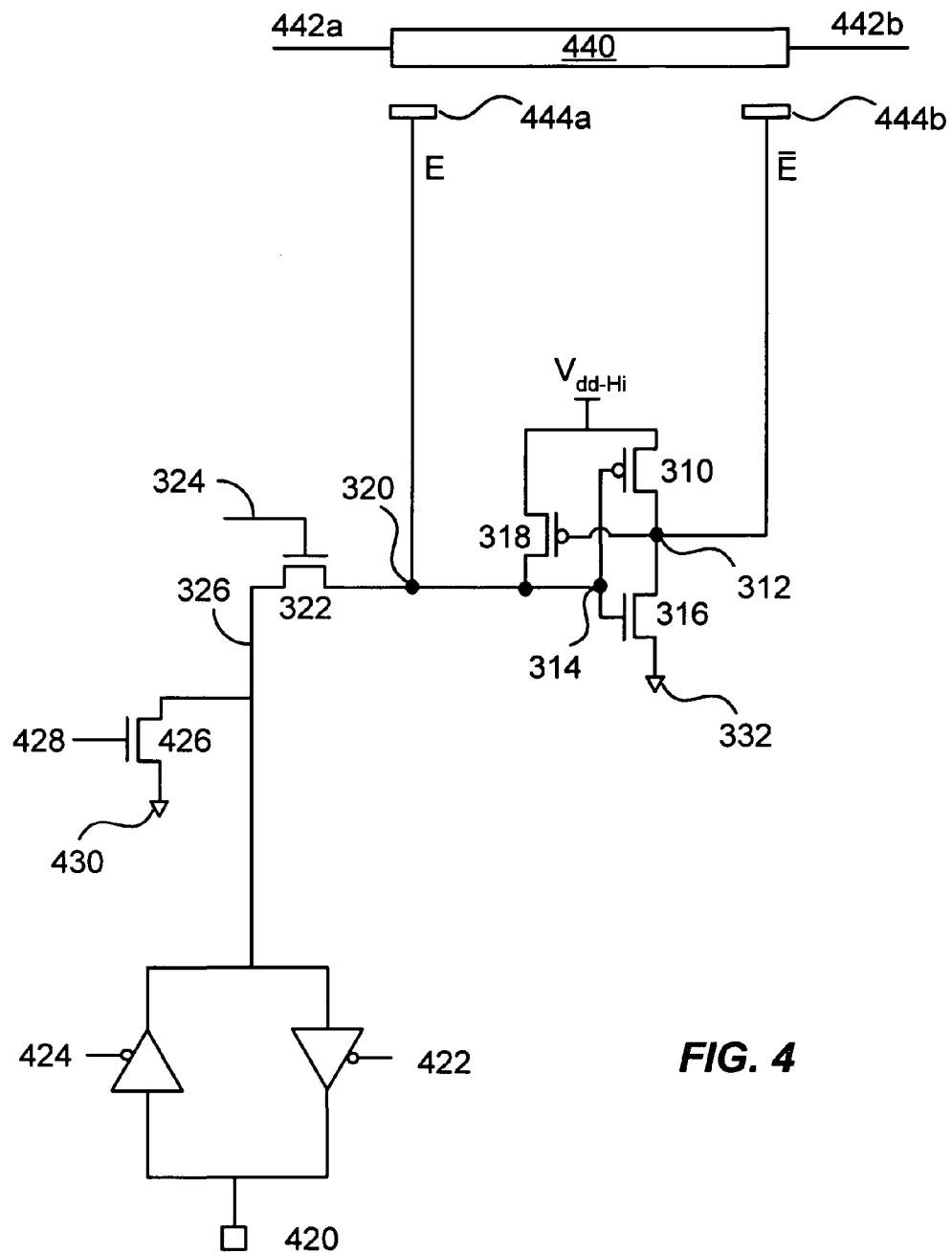
FIG. 4 is a simplified schematic illustration of an electrode circuit for an SLM and control circuitry according to an embodiment of the present invention.

FIG. 4 is a simplified schematic illustration of an electrode circuit for an SLM and control circuitry according to an embodiment of the present invention. As illustrated in FIG. 4, reference numbers used in FIG. 3A are reproduced in this figure for purposes of clarity. Electrode circuit 400 includes complementary electrodes 444a and 444b, coupled to electrode control lines E and $\overline{E}$, respectively. A mirror 440 is positioned adjacent to the electrodes and is actuated through the use of voltages applied to the electrodes. A source of a bias voltage is coupled to bias lines 442a and 442b as illustrated in FIG. 4. The source of select transistor 322 is coupled to additional control line 326, which is coupled to a precharge transistor 426. In some embodiments, the precharge transistor has a terminal coupled to ground 430 and the gate is coupled to a precharge control line 428. During selected phases of read and write operations, the precharge transistor 426 is turned on, thereby pulling the pulling the bit line 326 to ground. At other phases of these operations, the precharge transistor is turned off, enabling the bit line to operate at the voltage supplied by either the memory cell or the input/output pad 420.

Figure 7:
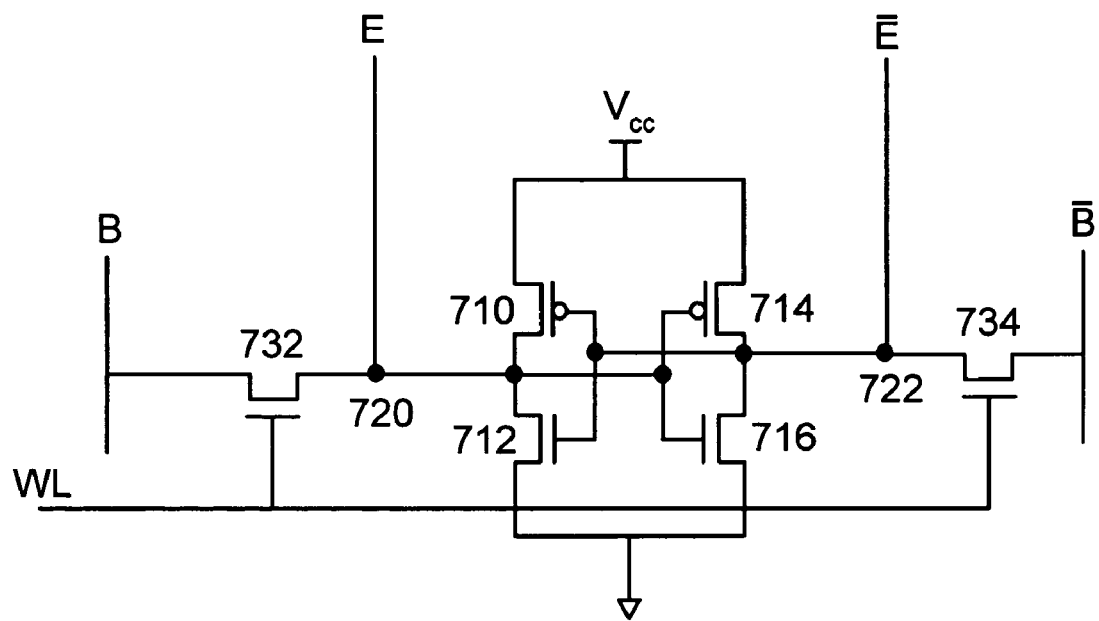
FIG. 7 is a simplified schematic illustration of a conventional six transistor SRAM memory element.

As illustrated in FIG. 4, control line 326 (typically a bit line) is coupled to a pair of tri-state buffers 422 and 424. In an embodiment, tri-state buffer 422 is used to provide a read enable signal when reading from the memory cell 300, thereby providing a read output to input/output pad 420. In another embodiment, tri-state buffer 424 is used to provide a write enable signal when writing to the memory cell 300. As further illustrated in FIG. 4, the memory cell utilizes only four transistors, not the six transistors commonly used in SRAM memory cells such as the one illustrated in FIG. 7. As a result, the memory cell provided according to embodiments of the present invention provides the latching benefits of six transistor SRAM memory cells while utilizing fewer components and less chip real estate.

Figure 5:
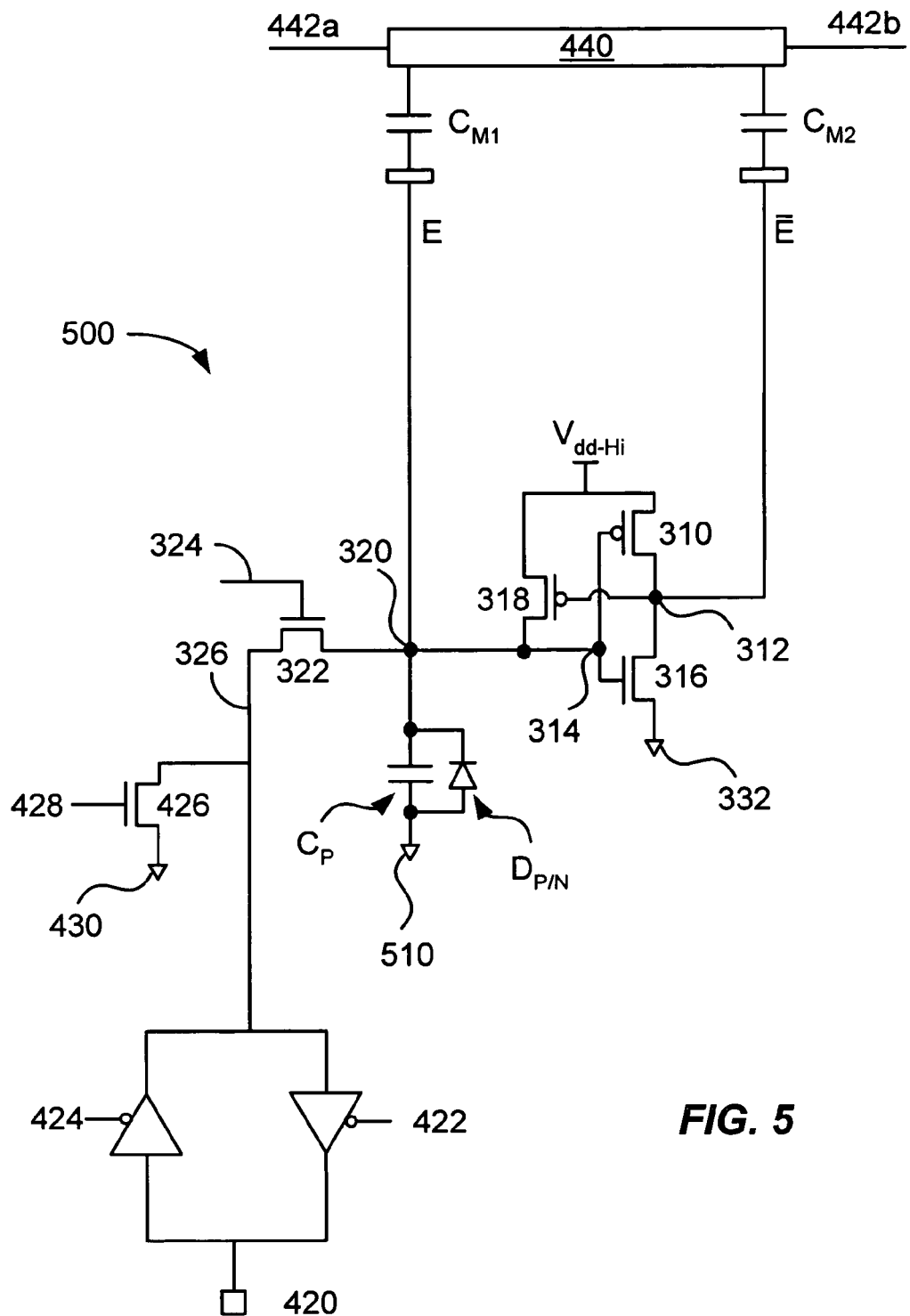
FIG. 5 is a simplified schematic illustration of an electrode circuit for an SLM, control circuitry, and a micro-mirror according to an embodiment of the present invention.
Figure 6:
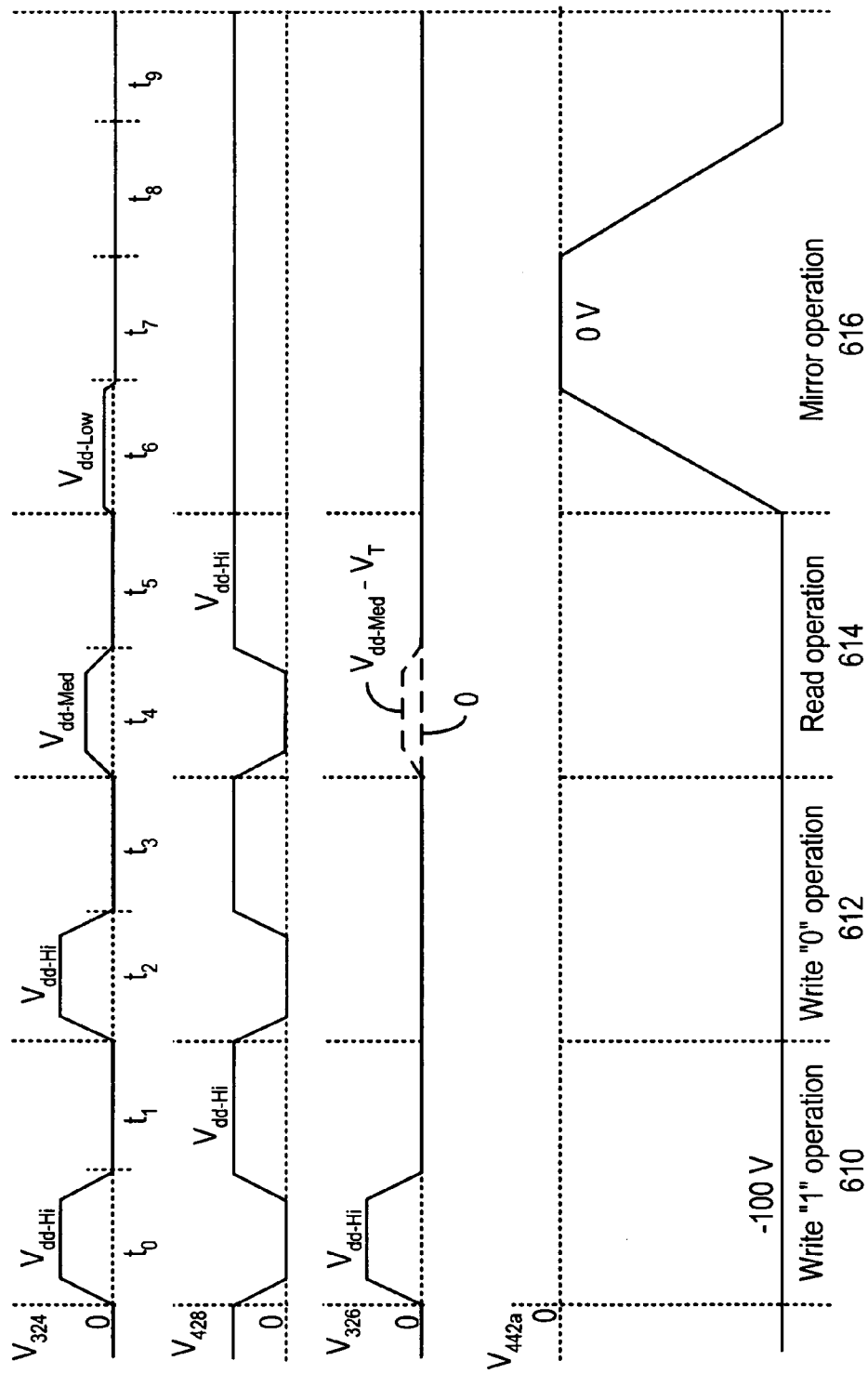
FIG. 6 is a simplified timing diagram for an electrode driver for an SLM according to an embodiment of the present invention.

FIGS. 6 is a simplified voltage timing diagram for an electrode driver for an SLM according to an embodiment of the present invention. As illustrated in FIG. 6, several write operations, a read operation, and a mirror operation are performed using embodiments of the present invention. The voltage versus time traces illustrated in FIG. 6 are referenced to the control lines illustrated in FIGS. 3A, 4, and 5. For example, control line 324, which is coupled to a word line in some embodiments, is illustrated as being operated at a variety of voltage levels as a function of time depending on the particular operation. According to some embodiments of the present invention, control lines 428, 326, and 442a are coupled to the precharge control line, the bit line, and the bias voltage, respectively.

Although the description of FIG. 6 refers to the operation of the memory cell as illustrated in FIG. 3A, embodiments of the present invention are not limited to the use of the particular memory cell illustrated in FIG. 3A. As will be evident to one of skill in the art, the memory cell shown in FIG. 3B is used in other embodiments. The operation of the memory cell 350 illustrated in FIG. 3B will be complementary to the operation of the memory cell 300 illustrated in FIG. 3A and apparent to one of skill in the art.

Operation 610 illustrates the writing of a "1" into the memory cell 300. For exemplary purposes, the control lines will be referred to in discussing memory cell operations as appropriate to an embodiment in which 324 is a word line, 326 is a bit line, 428 is a precharge line, and 442a is a bias voltage line. These examples are not intended to limit the scope of the present invention, but are merely provided as examples. One of ordinary skill in the art would recognize many variations, modifications, and alternatives.

During the write "1" operation 610, the word line is driven to a $V_{dd-Hi}$ level. This voltage level is illustrated during time $t_0$ in FIG. 6 on the graph associated with control line 324 (the word line in some embodiments). In a specific embodiment, $V_{dd-Hi}$=12 V, although this is not required by the present invention. In alternative embodiments, $V_{dd-Hi}$ ranges from about 10 V to about 20 V. During time $t_0$, the precharge voltage on line 428 is driven to ground, turning off the precharge transistor 426 and isolating the bit line. The bit line 326 is driven to a $V_{dd-Hi}$ level by using tri-state buffer 424 to provide a write enable signal, passing the "1" present at the input/output pad 420 to the bit line. During the write "1" operation, the bias voltage is maintained at a level of −100 V.

Referring o FIGS. 3 and 4, during time $t_0$, the bit line is set at $V_{dd-Hi}$ and the application of the voltage $V_{dd-Hi}$ to the word line 324 result in select transistor 322 turning on. As a result of select transistor 322 turning on, the voltage on the bit line ($V_{dd-Hi}$) is passed to node 320. The first NMOS transistor 316, of which the gate is coupled to node 320 is turned on, coupling node 312 to the second supply voltage (ground in the embodiment illustrated in FIGS. 3A and 3B).

With node 312 coupled to ground, the second PMOS transistor 318 is turned on, pulling node 320 to the first supply voltage ($V_{dd-Hi}$). Thus, node 320 is latched at $V_{dd-Hi}$. The first PMOS transistor 310 is turned off since node 314 is high, preserving node 312 at ground. Thus, the electrode coupled to E is maintained at a voltage of $V_{dd-Hi}$ during time $t_0$ and the electrode coupled to $\overline{E}$ is maintained at ground.

During time $t_1$, the voltage on the word line is driven to ground, turning select transistor 322 off. The voltage on the precharge control line is driven to $V_{dd-Hi}$, turning on transistor 426, thereby driving the bit line 326 to ground as illustrated in the graph associated with the bit line. Thus during time $t_1$, the voltages on electrodes E and $\overline{E}$ remain latched at the values provided during time $t_0$. In a specific embodiment, at the end of time $t_0$ and the beginning of time $t_1$, the word line is driven to ground prior to the bit line, thereby shutting off select transistor 322 before the bit line is grounded and reducing current flow from node 320, which could reduce the voltage on node 320.

Referring to FIGS. 3A and 4, transistor 322 is turned off at the end of the write "1" operation, isolating node 320 from the bit line 326. Since transistor 318 is turned on during the write "1" operation, node 320 is latched at "1" and connected to the source $V_{dd-Hi}$ until the next write operation is performed. Referring to FIG. 3B, transistor 340 is off at the end of the write "1" operation. With node 312 pulled to ground, transistor 340 is off and node 320 is floating high.

Operation 612 illustrates the writing of a "0" into the memory cell 300. For exemplary purposes, as above, the control lines will be referred to in discussing memory cell operations as appropriate to an embodiment in which 324 is a word line, 326 is a bit line, 428 is a precharge line, and 442a is a bias voltage line. These examples are not intended to limit the scope of the present invention, but are merely provided as examples. One of ordinary skill in the art would recognize many variations, modifications, and alternatives.

During a write "0" operation 612, the word line is driven to a $V_{dd-Hi}$ level. This voltage level is illustrated during time $t_2$ in FIG. 6 on the graph associated with control line 324 (the word line in the embodiment illustrated in FIGS. 3 and 4). In a specific embodiment, $V_{dd-Hi}$=12 V, although this is not required by the present invention. In alternative embodiments, $V_{dd-Hi}$ ranges from about 10 V to about 20 V. During time $t_2$, the precharge voltage goes low, turning off the precharge transistor 426 and isolating the bit line. The bit line voltage is driven to ground by using tri-state buffer 424 to provide a write enable signal, passing the "0" present at the input/output pad 420 to the bit line. During the write "0" operation, the bias voltage is maintained at a level of −100 V.

During time $t_2$, the application of the voltage $V_{dd-Hi}$ to the word line 324 result in select transistor 322 turning on. As a result of select transistor 322 turning on, the voltage on the bit line (ground) is passed to node 320. The first NMOS transistor 316, of which the gate is coupled to node 320, is turned off while the first PMOS transistor 310 is turned on, coupling node 312 to the first supply voltage ($V_{dd}$).

With node 312 coupled to $V_{dd-Hi}$, the second PMOS transistor 318 is turned off, preserving node 314 at ground. With the first PMOS transistor turned on and the first NMOS transistor and the second PMOS transistor turned off, node 320 and electrode E are at ground and node 312 and electrode $\overline{E}$ are at $V_{dd-Hi}$. Thus, during time $t_2$, the voltages on the electrodes are reversed in polarity from the values present during time $t_0$.

During time $t_3$, the voltage on the word line is driven to ground, turning select transistor 322 off. The voltage on the precharge control line is driven to $V_{dd-Hi}$, turning on transistor 426, thereby maintaining the bit line at ground as illustrated in the graph associated with the bit line. Referring to FIGS. 3 and 4, select transistor 322, first NMOS transistor, and second PMOS transistor 318 are turned off and first PMOS transistor 310 is on. Thus, during time $t_3$, the voltages on electrodes E and $\overline{E}$ remain latched at the values provided during time $t_2$.

Since the select transistor is turned off, node 320 is isolated from the bit line and is floating at ground after the write "0" operation. In situations where select transistor is considered as turned on, for example, considering leakage currents, the bit line 326 is at ground since the precharge transistor 426 is on during time $t_3$. Thus, node 320 of the memory cell, although not actively driven to ground during time $t_3$, will remain floating at ground until the next write operation. Referring to FIG. 3B, after a write "0" operation, node 312 is pulled to Vdd-Hi, resulting in transistor 340 turning on. Thus, the second NMOS transistor 340 serves to pull node 320 to ground, latching node 320 after the write "0" operation.

Memory cell 300 includes a pull-up PMOS transistor that latches node 320 high after a write "1" operation. Alternatively, memory cell 350 includes a pull-down NMOS transistor that latches node 320 low after a write "0" operation. The use of a particular embodiment will be a function of various design parameters and applications. Both memory cells provide a four transistor memory cell suitable for SLM operation. One of ordinary skill in the art would recognize many variations, modifications, and alternatives.

Operation 614 illustrates a read operation for memory cell 300. During the read operation 614, the word line is driven to a $V_{dd-Med}$ level. According to some embodiments, $$V_{dd-Med} \approx \frac{V_{dd-Hi}}{2}.$$

In a specific embodiment, $V_{dd-Med}$=6 V, although this is not required by the present invention. In alternative embodiments, $V_{dd-Med}$ ranges from about 5 V to about 10 V. During time $t_4$, the precharge voltage goes low, turning off the precharge transistor 426 and isolating the bit line. The bit line voltage is read once the select transistor is turned on by turning on tri-state buffer 422 to pass the voltage on the bit line to the input/output pad 420. During the read operation, the bias voltage is maintained at a level of −100 V.

During time $t_4$, the application of the voltage $V_{dd-Med}$ to the word line 324 results in select transistor 322 turning on by a predetermined amount. For MOS transistors, the saturated drain current $I_{DSat}$ is given by:

$$I_{DSat} = \mu C_{ox}\left(\frac{W}{L}\right)(V_{gs} - V_T)^2,$$

where μ is the mobility, $C_{ox}$ is the capacitance of the gate oxide, W is the width of the gate, L is the length of the gate, $V_{gs}$ is the gate to source voltage, and $V_T$ is the threshold voltage. Thus, during an exemplary write "1" operation described above, for which $V_{dd}$=12 V and $V_T$=2 V, $(V_{gs}-V_T)^2$=100, resulting in a first drain current. Reducing the gate-source voltage by a factor of two will reduce the $(V_{gs}-V_T)^2$ term from $10^2$=100 to $4^2$=16, thereby resulting in a second drain current about a factor of 6 times less than the first drain current.

According to embodiments of the present invention, the voltage $V_{dd-Med}$ is selected to provide a suitable amount of current through select transistor for read operations, while limiting the current so that node 320, at $V_{dd}$ after a write "1" operation, does not flip in polarity during the read operation. Embodiments of the present invention provide systems and techniques for operating memory cells that do not use the second pass gate or the second pull-down transistor found in conventional 6T SRAM memory cells. By applying the voltage $V_{dd-Med}$ to the select transistor, the current flow through the select transistor is controlled during read operations to limit the impact of the bit line capacitance during operation of the memory cell.

Thus, during read operations, the select transistor 322 is operated at a predetermined level, enabling the voltage at electrode E to be sensed using a controlled current passing from node 320 to the bit line 326. As illustrated in FIG. 6, if a "1" is stored in the memory cell at node 320, the voltage on the bit line 326 during the read operation is $V_{dd-Med}-V_T$, accounting for the threshold drop $(V_T)$ associated with transistor 322. Alternatively, if a "0" is stored in the memory cell at node 320, the voltage on the bit line 326 during the read operation is ground. Both of these conditions are illustrated in FIG. 6 by the dashed lines shown on the bit line 326 during the read operation.

Although the discussion of drain current above illustrates a reduction in current by a factor of six, the present invention is not limited to these particular values of current. As will be evident to one of skill in the art, the voltage $V_{dd-Med}$ will impact the rate at which current passes through the select transistor 322 and the speed of the read operation. Depending on the application, the voltage applied to the select transistor will be selected as appropriate to the particular application.

Although this mode of operation may result in longer read times than available with select transistor 322 fully turned on, such read times are generally acceptable in applications provided by embodiments of the present invention. For example, in a display application, read operations are generally only performed during device testing. Once the device testing phase is completed, read operations are generally not performed during display operation. For instance, write operations are used to generate the electrode control voltages and the resulting actuation of micro-mirrors in the array. The "output" of the display is not generally read out electronically, but visually as a viewer uses the display. Moreover, the longer read times that are acceptable in display applications, enable memory cell designs that do not utilizes differential sensing.

During a read operation, since transistor 426 is turned off, the voltage at node 320 is passed to the read enable tri-state buffer 422. Upon activation of tri-state buffer 422, the voltage on the bit line is passed to the input/output pad 420.

As will be evident to one of skill in the art, embodiments of the present invention enable the use of minimum design rule transistors compared to conventional 6T SRAM electrode driver designs that utilize larger transistors. In some conventional designs, transistors larger than minimum design rules are utilized to prevent flipping of the cell during read operations. In contrast with these conventional designs, embodiments of the present invention reduce the importance of the size of the transistor since the flow of current in the cell is controlled by the voltage applied to the gate of the select transistor during read operations. As described above, utilizing a gate voltage of $V_{dd-Med}$ for the select transistor, regulates the current flowing through the bit line, preventing flipping of the cell. Accordingly, the use of minimum transistor design rule transistors is enabled by embodiments of the present invention, reducing real estate occupied by the memory cell.

During time $t_5$, select transistor 322 is turned off and the precharge voltage is driven to $V_{dd-Hi}$, turning off the precharge transistor 426. Turning off select transistor 322 preserves the voltage on nodes 320 and 312, corresponding to electrodes E and Ē, respectively.

As will be evident to one of skill in the art, embodiments of the present invention precharge the bit line 326 to low during read operations. Precharging of the bit line to ground during time $t_4$, as illustrated in FIG. 6, contrasts with conventional SRAM memory cell designs, in which the bit line is precharged to a high voltage. Referring to FIG. 3A, node 320 is floating low when a "0" is provided to electrode E. Accordingly, the bit line is precharged low to maintain node 320 low despite leakage through select transistor 322. If node 326 was precharged high, leakage current through select transistor 322 coupled possibly flip the cell, resulting in the voltage at node 320 going high.

Operation 616 illustrates operation of the mirror 440. During the operation of the mirror, the word line is driven to a $V_{dd-Low}$ level as described in more detail below. According to embodiments of the present invention, $V_{dd-Low}$ is selected to be about equal to the threshold voltage of the select transistor $(V_T)$. In a specific embodiment, $V_{dd-Low}$=1.5 V, although this is not required by the present invention. In alternative embodiments, $V_{dd-Low}$ ranges from about 1 V to about 2 V. During time $t_6$, the precharge voltage is driven at $V_{dd-Hi}$, turning on precharge transistor 426 and grounding the bit line.

FIG. 5 is a simplified schematic illustration of an electrode circuit for an SLM, control circuitry, and a micro-mirror according to an embodiment of the present invention. For purposes of illustration, parasitic effects are illustrated in FIG. 5, including parasitic capacitances and diodes.

A first description of the mirror operation is provided for conditions in which node 320 is high, represented by the value "1." During time $t_6$, the bias voltage $V_{bias}$ on line 422a is changed from −100 V to ground. Referring to FIG. 5, parasitic capacitors $C_{M1}$ and $C_{M2}$ are illustrated between the mirror 440 and the electrodes E and Ē. This parasitic capacitor $C_M$ represents charge coupling between the mirror and the electrode. As will be evident to one of skill in the art, when the bias voltage applied to 442a is driven to −100 V, charge coupling through $C_{M1}$ will result in an increase in the voltage of $V_{dd}$=12 V present at node 320. Similar charge coupling through $C_{M2}$ will modify the voltage present at node 312. The increase in the voltage at node 320 will depend on the ratio of $C_{M1}:C_P$, where $C_P$ represents the parasitic capacitance associated with the routing metal, diffusion, and polysilicon gate capacitance of node 320. For typical embodiments of the present invention, the ratio $C_{M1}:C_P$ is about 1:10. Therefore, the additional voltage at node 320 will result in current from to $V_{dd-Hi}$ through transistor 318. Generally, operation of the micromirror when node 320 is high does not result in significant alterations of the voltages on the electrodes E and $\overline{E}$. Thus, node 320 remains latched at $V_{dd-Hi}$ during mirror operations for which a "1" is written into the memory cell.

Referring again to FIG. 6, during time $t_6$, the word line is driven to a $V_{dd-Low}$ level, resulting in a predetermined current flow through the select transistor 322. As discussed in relation to the read operations, reduction of the voltage applied to the gate of the select transistor results in a decrease in current flow as the square of the $(V_{gs}-V_T)$ term. For $V_{gs} \approx V_T$, a minimal amount of current flows through the select transistor 322. Thus, during time $t_6$, a small amount of current may flow through the select transistor. During mirror operation (time $t_6$-$t_9$), current flow through the select transistor provides an additional current path to shunt the additional voltage resulting from charge coupling.

The other condition for mirror operation, in which node 320 is low, is represented by the value "0" being stored in the memory cell. As discussed previously, after a write "0" operation, node 320 is floating at ground. Therefore, when the bias voltage is changed from −100 V to ground during time $t_6$, the charge coupling through parasitic capacitor $C_M$ will tend to increase the voltage at node 320 according to the previously discussed ratio $C_M$:$C_P$. If node 320 is isolated and floating, charge coupling would tend to increase the voltage at node 320 by approximately 10 V for a ratio $C_M$:$C_P$ of about 1:10. In order to counteract this voltage increase due to charge coupling, embodiments of the present invention provide a voltage at the gate of the select transistor that enables a small current flow through the select transistor. Thus, as discussed above, application of the voltage $V_{dd-Low}$ to the gate of the select transistor 322 enables current to flow from node 320 to ground (the bit line voltage is at ground since the precharge transistor is high) during time $t_6$. The amount of current flow through the select transistor 322 will depend on the particular applications and will generally balance the current flow from $V_{dd}$ to ground through transistor 318 when node 320 is high against the desired current flow from node 320 to ground through transistor 322 when node 320 is low. During times $t_7$, $t_8$, and $t_9$, the select transistor is turned off.

During time $t_8$, the bias voltage $V_{bias}$ is reduced back to a level of −100 V, where it is maintained during time $t_9$. Once again, two conditions for the voltage at node 320 are considered. For node 320 high ("1"), the change in the bias voltage during time $t_8$ from ground to −100 V results in the voltage at node 320 being decreased through charge coupling. Because transistor 318 is on when node 320 is high, the current available from $V_{dd}$ through transistor 318 will maintain node 320 at $V_{dd}$. For node 320 at ground ("0"), the change in bias voltage will tend to decrease the voltage from ground to approximately −10 V. As illustrated in FIG. 5, the p/n junction diode $D_{P/N}$ will clamp the voltage at about −0.7 V as current is shunted to ground 510.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A memory cell for driving a complementary pair of electrodes associated with a micro-mirror of a spatial light modulator, the memory cell comprising:
   a first PMOS transistor, wherein a source of the first PMOS transistor is coupled to a first supply voltage;
   a first NMOS transistor, wherein a drain of the first NMOS transistor is coupled to a drain of the first PMOS transistor, a source of the first NMOS transistor is coupled to a second supply voltage, and a gate of the first NMOS transistor is coupled to a gate of the first PMOS transistor;
   a second transistor adapted to establish a conduction path between the gate of the first NMOS transistor and at least one of the first supply voltage or the second supply voltage; and
   a select transistor, wherein a drain of the select transistor is coupled to the gate of the first NMOS transistor; and
   a voltage source coupled to the gate of the select transistor, wherein the voltage source is configured to provide a first voltage less than or equal to the first supply voltage to the gate of the select transistor during a write operation and a second voltage to the gate of the select transistor during a read operation, the second voltage being less than the first voltage.

2. The memory cell of claim 1 wherein the second transistor is a second PMOS transistor, a source of the second PMOS transistor is coupled to the first supply voltage, a gate of the second PMOS transistor is coupled to the drain of the first PMOS transistor, and a drain of the second PMOS transistor is coupled to the gate of the first PMOS transistor.

3. The memory cell of claim 1 wherein the second transistor is a second NMOS transistor, a source of the second NMOS transistor is coupled to the second supply voltage, a gate of the second NMOS transistor is coupled to the gate of the first NMOS transistor, and a drain of the second NMOS transistor is coupled to the drain of the first PMOS transistor.

4. The memory cell of claim 1 wherein the the select transistor is configured to support both write signals to and read signals from one of the electrodes of the complementary pair of electrodes.

5. The memory cell of claim 1 wherein the select transistor is a third NMOS transistor.

6. The memory cell of claim 1 wherein the the gate of the first NMOS transistor is only connected to the gate of the first PMOS transistor, the drain of the second transistor, and the drain of the select transistor.

7. The memory cell of claim 1 wherein a ratio of a channel width to a channel length for the first NMOS transistor is substantially equal to a ratio of a channel width to a channel length for the select transistor.

8. The memory cell of claim 1 wherein the first supply voltage is $V_{dd-Hi}$.

9. The memory cell of claim 1 wherein the second supply voltage is ground.

10. The memory cell of claim 1 further comprising a precharge transistor adapted to couple a bit line to ground in response to a precharge signal, wherein the bit line is coupled to a source of the select transistor.

11. The memory cell of claim 10 wherein the precharge transistor is an NMOS transistor.

12. The memory cell of claim 10 wherein to write a "1" into the memory cell:
   a gate of the select transistor is coupled to a third supply voltage,
   the precharge signal is set at ground, and
   the bit line is coupled to a fourth supply voltage, thereby turning on the first NMOS transistor and the second transistor.

13. The memory cell of claim 12 wherein the second transistor remains on after the gate of the select transistor is coupled to ground.

14. The memory cell of claim 12 wherein the first supply voltage and the third supply voltage are $V_{dd-Hi}$.

15. The memory cell of claim 12 wherein the fourth supply voltage is $V_{dd-Hi}$.

16. The memory cell of claim 10 wherein to write a "0" into the memory cell:
   a gate of the select transistor is coupled to a third supply voltage,
   the precharge signal is set at ground, and
   the bit line is coupled to the second supply voltage, thereby turning on the first PMOS transistor and turning off the second transistor.

17. The memory cell of claim 16 wherein the first PMOS transistor remains on and the second transistor remains off after the gate of the select transistor is coupled to the third supply voltage.

18. The memory cell of claim 10 wherein to read a value stored in the memory cell:
   a gate of the select transistor is coupled to a fifth supply voltage, thereby limiting a flow of current through the select transistor, and
   the precharge signal is set at ground, whereby the value stored in the memory cell is detected on the bit line.

19. The memory cell of claim 18 wherein the first supply voltage is $V_{dd-Hi}$ and the fifth supply voltage is approximately equal to $V_{dd-Hi}/2$.

20. The memory cell of claim 1 wherein a drain of the first PMOS transistor is coupled to a first electrode of the complementary pair of electrodes and the gate of the first NMOS transistor is coupled to a second electrode of the complementary pair of electrodes.

21. The memory cell of claim 20 wherein to operate a micro-mirror associated with the memory cell:
   a gate of the select transistor is coupled to a sixth supply voltage, thereby limiting a flow of current through the select transistor,
   a precharge signal is set at the first supply voltage, and
   a bias voltage is increased from a seventh supply voltage to an eighth supply voltage.

22. The memory cell of claim 21 wherein the sixth supply voltage is approximately equal to a $V_T$ of the select transistor, the seventh supply voltage is approximately equal to −100 V, and the eighth supply voltage is equal to ground.

23. The memory cell of claim 1 wherein the gate of the first NMOS transistor is free from a connection to any terminal of an additional transistor.

24. A method of operating a memory cell for driving a complementary pair of electrodes comprising a first electrode and a second electrode, the memory cell associated with a micro-mirror of a spatial light modulator, the method comprising:
   applying a first drive voltage to a gate of a select transistor during a read operation, wherein a drain of the select transistor is coupled to a first node;
   applying a second drive voltage to the gate of the select transistor during a write operation, wherein the second drive voltage is greater than the first drive voltage;
   applying a third drive voltage to a bias line coupled to the first electrode, wherein the first electrode is coupled to the first node; and
   shunting current from the first node to a first supply voltage through a PMOS transistor, wherein a drain of the PMOS transistor is coupled to the first node, a source of the PMOS transistor is coupled to the first supply voltage, and a gate of the PMOS transistor is free from connection to a gate of an additional transistor.

25. The method of claim 24 wherein the first drive voltage is less than 5 V.

26. The method of claim 25 wherein the first drive voltage is less than 1.5 V.

27. The method of claim 24 wherein the third drive voltage is ground.

28. The method of claim 24 wherein the gate of the select transistor is coupled to a word line.

29. The method of claim 24 wherein a gate of the PMOS transistor is only connected to source or drain terminal of additional transistors.

30. The method of claim 24 wherein the select transistor is configured to support both write signals to and read signals from the first electrode.

* * * * *